(12) United States Patent
Lin et al.

(10) Patent No.: US 10,079,613 B2
(45) Date of Patent: Sep. 18, 2018

(54) DATA MAPPING SCHEME FOR GENERALIZED PRODUCT CODES

(71) Applicant: SK hynix Inc., Gyeonggi-do OT (KR)

(72) Inventors: Yi-Min Lin, San Jose, CA (US); Aman Bhatia, San Jose, CA (US); Naveen Kumar, San Jose, CA (US); Johnson Yen, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/356,069

(22) Filed: Nov. 18, 2016

(65) Prior Publication Data

US 2018/0145705 A1    May 24, 2018

(51) Int. Cl.
| | |
|---|---|
| *H03M 13/00* | (2006.01) |
| *H03M 13/29* | (2006.01) |
| *G06F 3/06* | (2006.01) |
| *G06F 11/10* | (2006.01) |
| *G11C 29/52* | (2006.01) |

(52) U.S. Cl.
CPC ........ *H03M 13/2909* (2013.01); *G06F 3/064* (2013.01); *G06F 3/0619* (2013.01); *G06F 3/0679* (2013.01); *G06F 11/1068* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 6,810,500 | B1 * | 10/2004 | Chang ................. | G06F 11/1012 348/441 |
| 8,631,304 | B2 * | 1/2014 | Lasser ................. | G06F 11/1012 714/776 |
| 2008/0168329 | A1 * | 7/2008 | Han .................... | G06F 11/1012 714/764 |
| 2013/0179753 | A1 * | 7/2013 | Flynn .................. | G06F 12/0253 714/773 |
| 2013/0205183 | A1 * | 8/2013 | Fillingim ............ | G06F 11/1044 714/773 |
| 2015/0333773 | A1 * | 11/2015 | Fillingim ............ | G06F 11/1044 714/764 |
| 2016/0182187 | A1 * | 6/2016 | Kim ..................... | H03M 13/09 714/807 |

* cited by examiner

*Primary Examiner* — Daniel F. McMahon
(74) *Attorney, Agent, or Firm* — IP & T Group LLP

(57) ABSTRACT

Memory systems and operating methods thereof comprise a memory storage and an error control coding (ECC) unit. The memory storage stores data which is split into a plurality of data chunks. The error control coding (ECC) unit is suitable for arranging each data chunk into codewords, each data chunk is arranged as part of at least two codewords, and mapping the codewords by reverse indexing the data chunks.

18 Claims, 8 Drawing Sheets

50

60

70

80

DATA MAPPING SCHEME FOR GENERALIZED PRODUCT CODES

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

Data written in flash memory (e.g., NAND) is subject to read errors, the data is typically protected by error correcting codes. The error correcting codes may still fail in some cases. Thus, there exists a need for improved error correcting codes and processes for overcoming read errors.

SUMMARY

Aspects of the invention include memory systems. The memory systems may include a memory storage including data split into a plurality of data chunks, and an error control coding (ECC) unit suitable for arranging each data chunk into codewords, each data chunk being arranged as part of at least two codewords, and mapping the codewords by reverse indexing the data chunks.

Further aspects of the invention include methods. The methods may include arranging, with an error control coding (ECC) unit, each data chunk of a plurality of data chunks into codewords, each data chunk being arranged as part of at least two codewords, and mapping the codewords by reverse indexing the data chunks.

Additional aspects of the invention include memory devices. The memory devices may include a memory storage including data split into a plurality of data chunks, and an error control coding (ECC) unit configured to arrange each data chunk into codewords, each data chunk being arranged as part of at least two codewords, and map the codewords by reverse indexing the data chunks.

DETAILED DESCRIPTION

Figure 1:
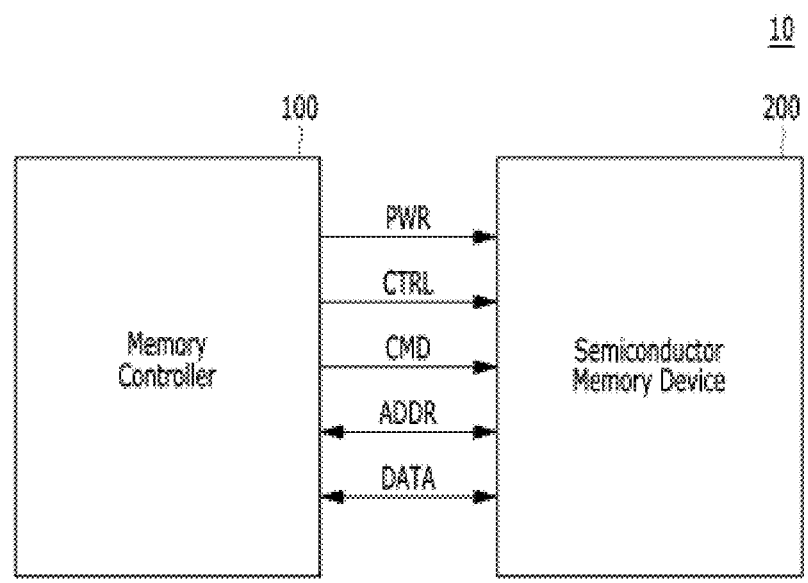
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines.

The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
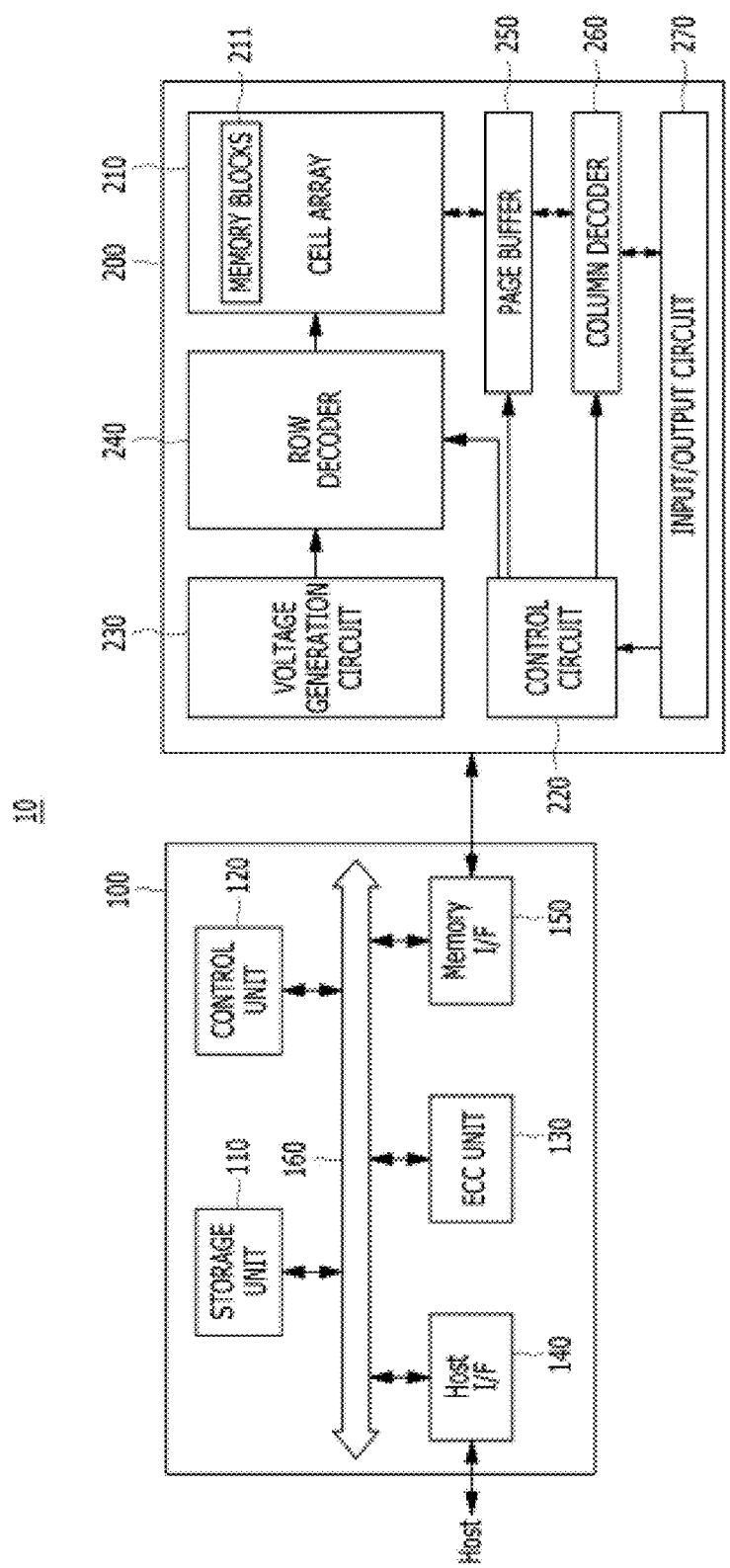
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
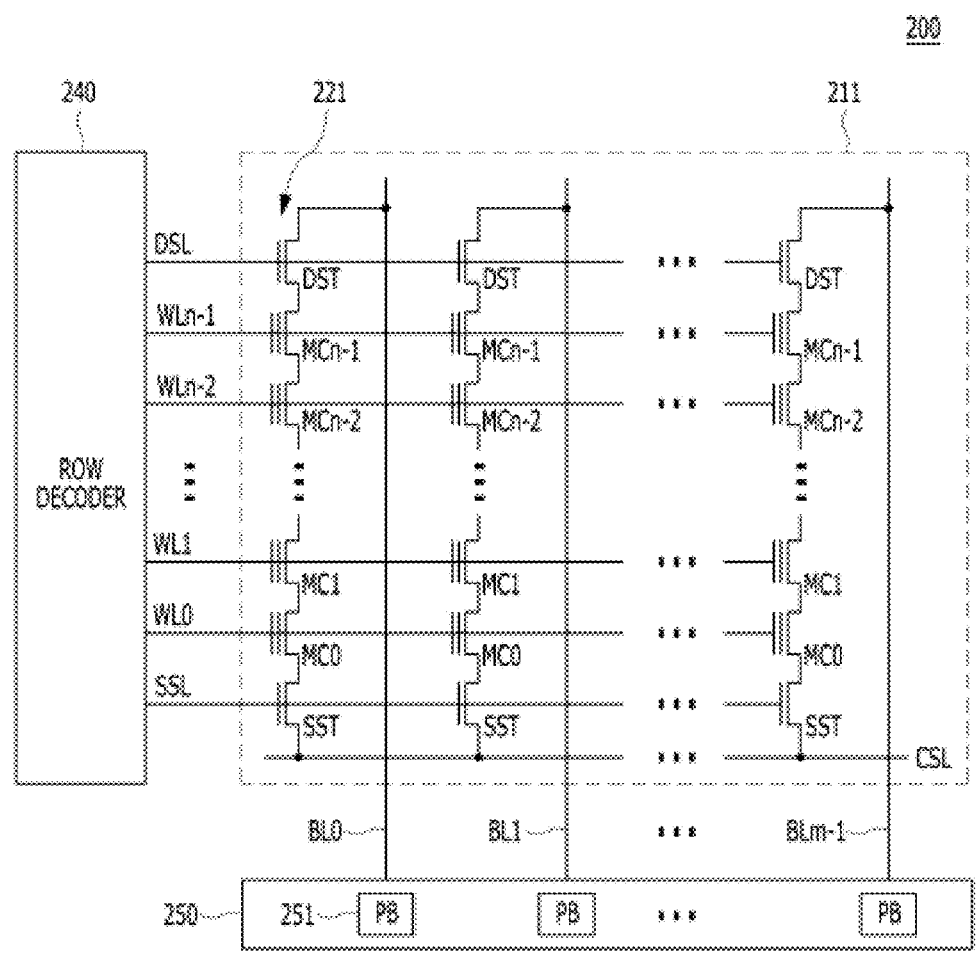
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
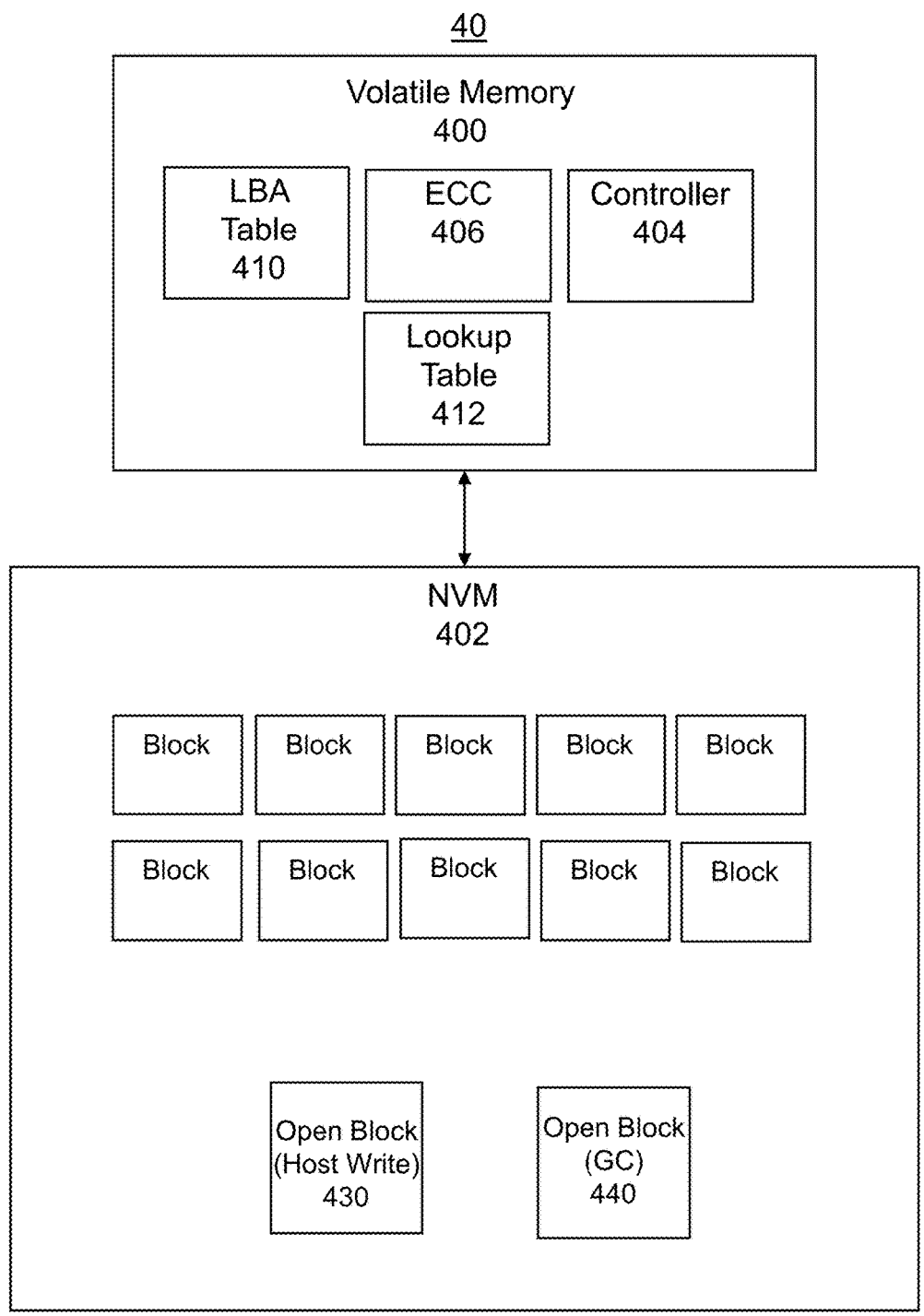
FIG. 4 is a diagram of an example memory system according to aspects of the invention.

At FIG. 4, a general example of a memory system 40 is shown. The memory system 40 may include a volatile memory 400 (e.g., a DRAM) and a non-volatile memory (NVM) 402 (e.g., NAND) in communication with the volatile memory 400. The volatile memory 400 may include a controller 404, such as the controllers described herein, an error correcting code module 406, a logical bit address LBA table 410 for mapping physical to logical addresses of bits, and a lookup table 412 (LUT) which may be utilized for storing addresses and indexes of products codes as will be described in further detail below. Although shown on the volatile memory 400, the components, such as the ECC 406, controller 404, LBA table 410, LUT 412, etc. may be additionally or alternatively located on the NVM 402 or an additional intermediate device (not shown). The NVM 402 may include a plurality of memory blocks (and/or a plurality of super memory blocks), as well as an open block for host writes 430 and an open block for garbage collection (GC) 440. The memory system 40 shows a general memory system, and additional/alternative components that may be utilized with memory systems to effectuate the invention disclosed herein will be understood to those of skill in the art.

As referred to herein, terms such as "NAND" or "NVM" may refer to non-volatile memories such as flash memories which may implement error correcting code processes. Further, "DRAM" may refer to volatile memories which may include components such as controllers and ECC modules.

In NAND flash storage applications, error control coding (ECC) is used for providing data integrity. Because of the deteriorating reliability in NAND flash memories, more powerful ECC agents are desirable. A new class of codes, referred to herein as "generalized product codes (GPCs)," as compared to BCH and LDPC codes, can provide better hard decoding performance with a low complexity encoder/decoder.

In GPC code structure, data bits in each chunk are shared with two different constituent codewords. A chunk is a basic unit for updating either syndrome memory or data memory. If an error is found in a chunk of a constituent codeword, syndrome values for two constituent codewords have to be updated since they share the same chunk. For syndrome updating, a mapping table is needed to indicate how two constituent codewords share the same chunk. Moreover, a mapping from one chunk of a constituent codeword to one chunk of a GPC codeword is needed for data updating.

Since GPC is designed for large codeword sizes, like 2 KB or 4 KB, the size of mapping tables are typically large, resulting in high hardware cost and long timing path. Disclosed herein are systems, methods, processes, and devices employing a new data mapping scheme which could be used for both syndrome and data update with small hardware complexity.

Figure 5:
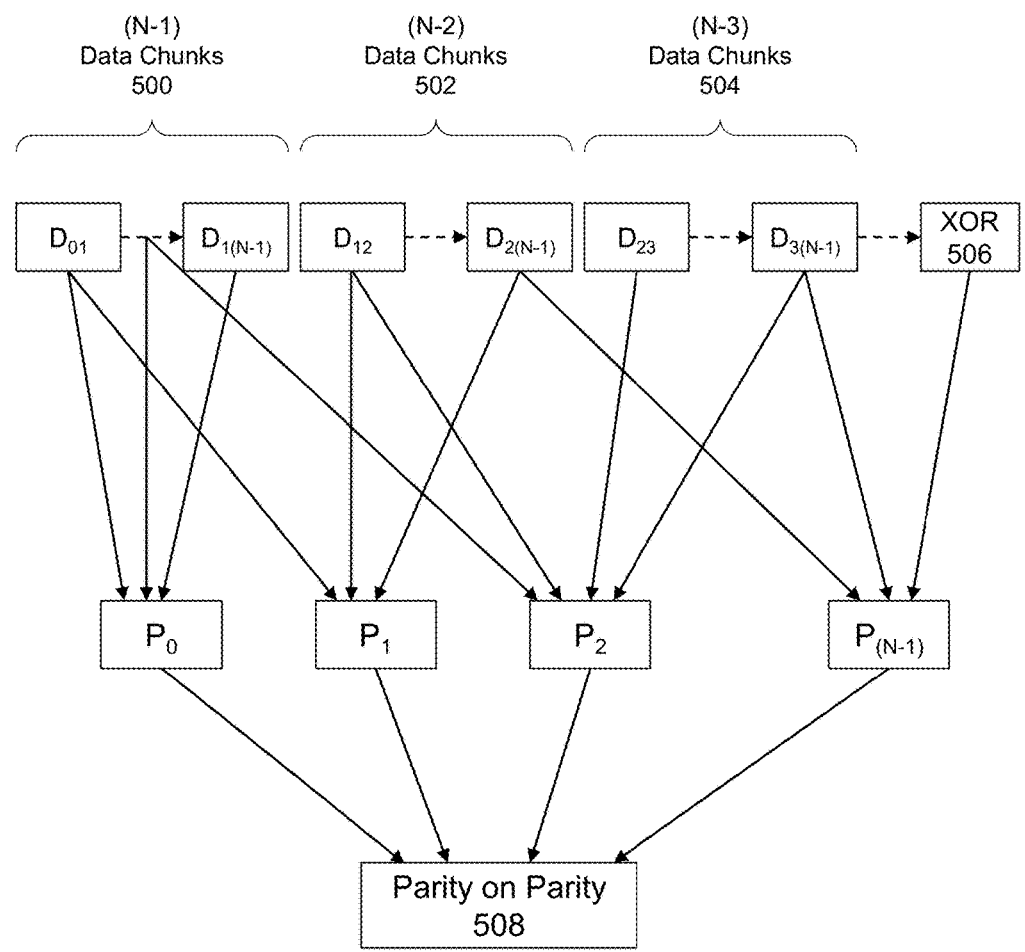
FIG. 5 is a diagram of example general product codes according to examples of the invention.

FIG. 5 is a diagram 50 is a basic GPC code structure. The data is split into chunks (chunks 500, 502, and 504) and each chunk of data participates in two different constituent codewords. The parity of each constituent codeword (e.g., P0, P1, P2, etc.) is further protected by Parity on Parity (POP) 508 of constituent codewords. The XOR 506 information of data is used to remove error floors that may occur due to the small error correction capability of the individual constituent codes. It is not easy to point out which two constituent codewords share a certain chunk as well as how one chunk of a constituent codeword is related to one chunk of a GPC codeword. If the straightforward mapping scheme is applied for both cases, the mapping complexity are $O(N^2)$, where N is the number of chucks in a constituent codeword. The invention disclosed herein utilizes a new two-dimension mapping scheme which only needs $O(1)$ for syndrome updating and $O(N)$ for data updating.

Figure 6:
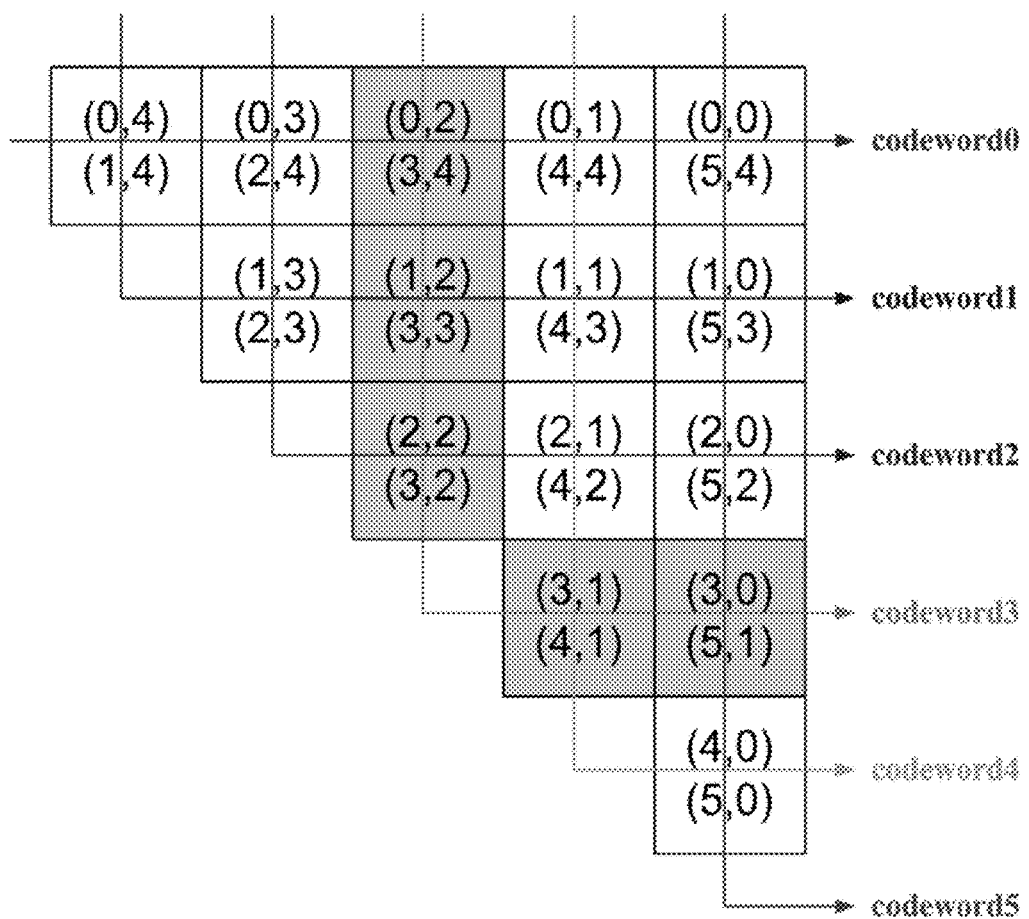
FIGS. 6, 7, and 8 are diagrams of example mappings of constituent codewords in accordance with aspects of the invention.

A general GPC mapping structure 60 is shown in FIG. 6. GPC code structure can be represented with an upper triangular shape. To reduce the mapping complexity, a two-dimension mapping scheme is disclosed herein. A chunk may be represented by two index values (i, j), where i is the constituent codeword index and j is the chunk location index within a constituent codeword. For example, (3,2) means the second chunk in the third constituent codeword. Also, the chunk represented by (3,2) could be represented by (2,2), too. With two-dimension representation, it is easy to know how a chunk is shared by two different constituent codewords. However, it is still not easy to do transformation between two representations.

Figure 7:
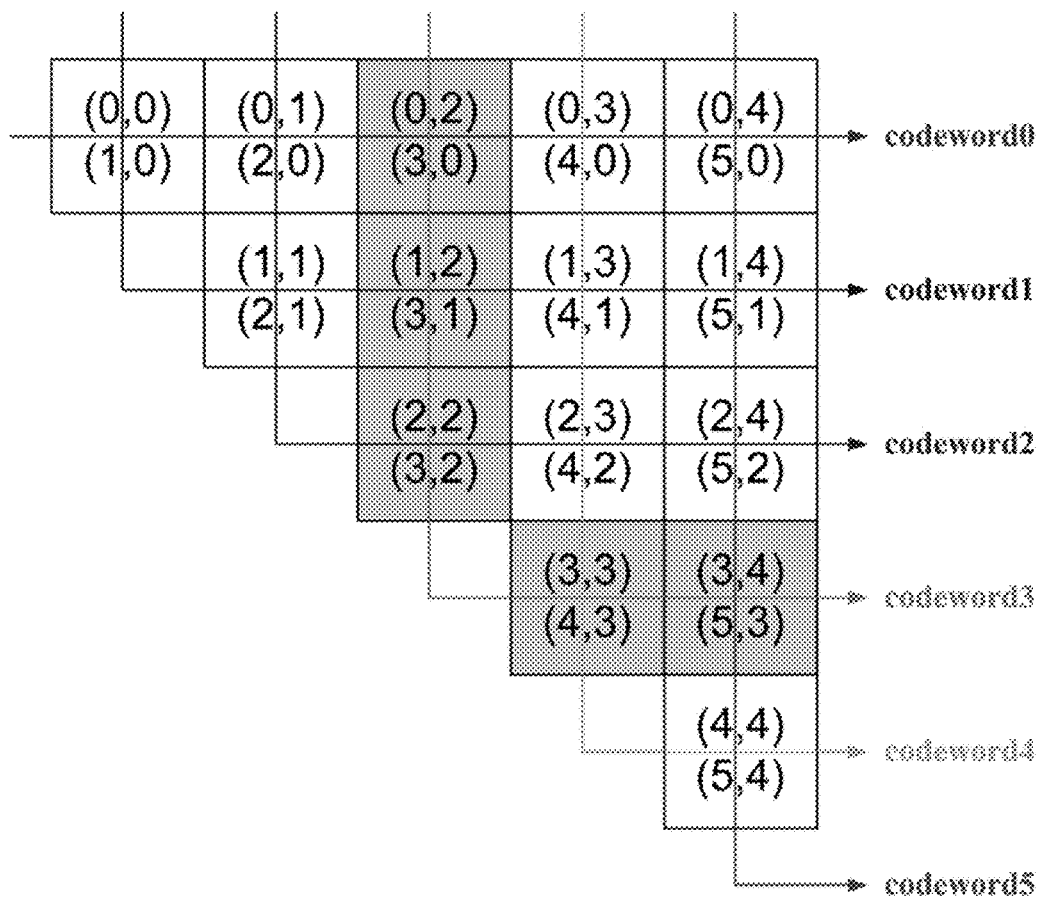

FIG. 7 is a diagram 70 of a mapping structure with a reversed index structure. With revered index, it is easy to covert one representation to another with the following formulation. The mapping complexity for syndrome updating is reduced from $O(N^2)$ to $O(1)$. For example, using the relationships if (i <= j)
(j+1, i)
else
(j, i-1)

Figure 8:
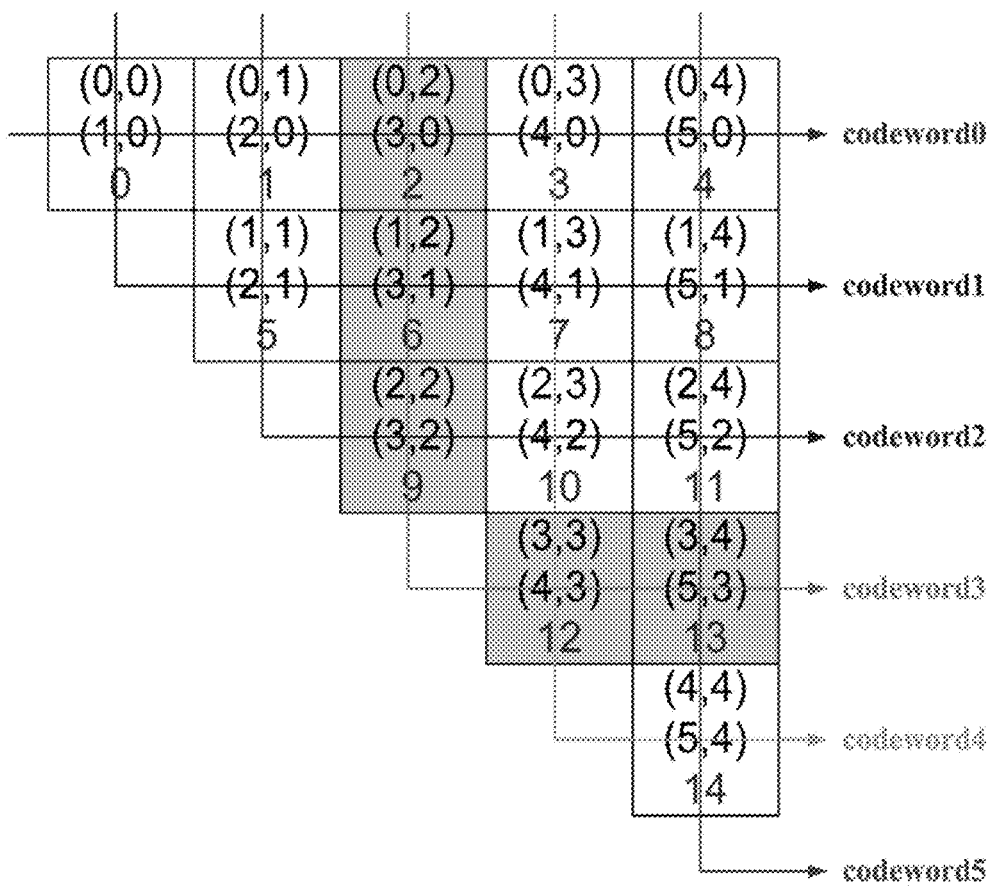

An additional two dimension mapping scheme 80 is shown in FIG. 8 with a reversed index for syndrome and data updating. Each chunk has three different representations, where two of them are (i, j) representations to point out the chuck location within one constituent codeword and the other representation below each index (the number) is to indicate the chunk location within one GPC codeword. The direct mapping complexity is $O(N^2)$. Since the code structure is an upper triangular shape, the relation between (k) and (i,j) is:

$$k = N \times i - \frac{i^2}{2} - \frac{i}{2} + j$$

where i should be less than or equal to j.

Therefore, k may be calculated with a small look up table (LUT) for all the computation related to i and an adder for summation for j. The mapping complexity is reduced to $O(N)$.

Thus, the proposed data mapping scheme utilizes two-dimension mapping method to represent the location information of a chunk. With reversed index, the mapping for syndrome updating is a simple addition operation. By reformulating the relation between chunk location information in a constitution codeword and a GPC codeword, the mapping for data updating becomes a LUT and an addition operations. The proposed mapping scheme helps to reduce the mapping complexity, leading to low hardware complexity.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system, comprising:
   a memory storage storing data split into a plurality of data chunks; and
   an error control coding (ECC) unit suitable for:
      reading data, representing a communication, from the memory storage;
      constructing codewords with the plurality of data chunks of the read data, wherein each of the data chunks is shared by at least two codewords;
      mapping the codewords with the data chunks by a multi-dimension mapping scheme with reverse indexing to convert between two different representations of the same data chunks to update syndrome values for two codewords sharing the same data chunk, wherein mapping complexity of the multi-dimension mapping scheme is reduced to O(N) or less, and N is the number of data chunks in a single codeword; and
      detecting and correcting errors in the data read from the memory device using the multi-dimension mapping scheme with reverse indexing to correctly represent the communication.

2. The memory system of claim 1, wherein the multi-dimension mapping scheme with reverse indexing includes at least a representation of indexing a data chunk location within a constituent codeword.

3. The memory system of claim 1, wherein the multi-dimension mapping scheme with reverse indexing includes at least a representation of indexing a data chunk location within a general product code (GPC) codeword.

4. The memory system of claim 1, further comprising a lookup table (LUT).

5. The memory system of claim 4, wherein the ECC unit is further suitable for mapping the codewords by making computations for the reverse indexing using the LUT.

6. The memory system of claim 1, wherein the plurality of data chunks is split according to a general product code structure.

7. A method, comprising:
   reading data, representing a communication, from the memory storage;
   constructing codewords with a plurality of data chunks of the read data, with an error control coding (ECC) unit, wherein each of the data chunks is shared by at least two codewords;

mapping the codewords with the data chunks using a multi-dimension mapping scheme with reverse indexing to convert between two different representations of the same data chunk to update syndrome values for two codewords sharing the same data chunk, wherein mapping complexity of the multi-dimension mapping scheme is reduced to O(N) or less, and N is the number of data chunks in a single codeword; and detecting and correcting errors in the data read from the memory device using the multi-dimension mapping scheme with reverse indexing to correctly represent the communication.

8. The method of claim 7, wherein the multi-dimension mapping scheme with reverse indexing includes at least a representation of indexing a data chunk location within a constituent codeword.

9. The method of claim 7, wherein the multi-dimension mapping scheme with reverse indexing includes at least a representation of indexing a data chunk location within a general product code (GPC) codeword.

10. The method of claim 7, further comprising providing a lookup table (LUT).

11. The method of claim 10, further comprising mapping the codewords by making computations for the reverse indexing using the LUT.

12. The method of claim 7, wherein the plurality of data chunks is split according to a general product code structure.

13. A memory device, comprising:
a memory storage storing data split into a plurality of data chunks; and
an error control coding (ECC) unit configured to:
read data, representing a communication, from the memory storage;
construct codewords with the plurality of data chunks of the read data, wherein each of the data chunks is shared by at least two codewords;
map the codewords with the data chunks by a multi-dimension mapping scheme with reverse indexing to convert between two different representations of the same data chunk to update syndrome values for two codewords sharing the same data chunk, wherein mapping complexity of the multi-dimension mapping scheme is reduced to O(N) or less, and N is the number of data chunks in a single codeword; and
detect and correct errors in the data read from the memory device using the multi-dimension mapping scheme with reverse indexing to correctly represent the communication.

14. The memory device of claim 13, wherein the multi-dimension mapping scheme with reverse indexing includes at least a representation of indexing a data chunk location within a constituent codeword.

15. The memory device of claim 13, wherein the multi-dimension mapping scheme with reverse indexing includes at least a representation of indexing a data chunk location within a general product code (GPC) codeword.

16. The memory device of claim 13, further comprising a lookup table (LUT).

17. The memory device of claim 16, wherein the ECC unit is further configured to map the codewords by making computations for the reverse indexing using the LUT.

18. The memory device of claim 13, wherein the plurality of data chunks is split according to a general product code structure.

* * * * *